United States Patent [19]

Miniet

[11] Patent Number: 4,567,543
[45] Date of Patent: Jan. 28, 1986

[54] DOUBLE-SIDED FLEXIBLE ELECTRONIC CIRCUIT MODULE

[75] Inventor: Jay J. Miniet, Fort Lauderdale, Fla.

[73] Assignee: Motorola, Inc., Schaumburg, Ill.

[21] Appl. No.: 466,466

[22] Filed: Feb. 15, 1983

[51] Int. Cl.[4] ............................................. H05K 1/00
[52] U.S. Cl. .................................... 361/398; 361/410; 361/414
[58] Field of Search ............... 361/400, 398, 399, 410, 361/412, 414; 339/18 R, 18 B, 17 F

[56] References Cited

U.S. PATENT DOCUMENTS

| | | | |
|---|---|---|---|
| 3,105,869 | 11/1963 | Branch et al. | 361/398 |
| 3,644,661 | 2/1972 | Asar et al. | 339/18 R |
| 3,766,439 | 10/1973 | Isaacson | 361/398 |
| 3,873,889 | 3/1975 | Leyba | 361/392 |
| 3,950,060 | 4/1976 | Stipanuk et al. | 339/17 F |
| 3,971,127 | 7/1976 | Giguere et al. | 29/626 |
| 4,080,027 | 3/1978 | Benasutti | 339/17 F |
| 4,104,701 | 8/1978 | Baranowski | 361/386 |
| 4,139,881 | 2/1979 | Shimizu et al. | 361/400 |
| 4,296,457 | 10/1981 | Hahlganss | 361/398 |
| 4,439,815 | 3/1984 | Close et al. | 361/398 |

FOREIGN PATENT DOCUMENTS 2155325 3/1973 Fed. Rep. of Germany ...... 361/414

OTHER PUBLICATIONS

Technograph Printed Circuits Ltd., "Foldable Printed Circuits", 1969.

Primary Examiner—A. D. Pellinen
Assistant Examiner—Gregory D. Thompson
Attorney, Agent, or Firm—Charles L. Warren; Edward M. Roney; Donald B. Southard

[57] ABSTRACT

A double-sided flexible electronic circuit module is provided having a flexible printed circuit board. The flexible circuit board has a plurality of conductive paths on each surface and a plurality of conductively plated-through apertures being connected to the conductive paths. One side of the flexible circuit board is adapted to carry components with leads; the other side of the flexible circuit board is adapted to receive components without leads. A carrier member, larger than the flexible circuit board and of a size and shape sufficient to accommodate the placement of at least one flexible circuit board, is also provided. The carrier member has a plurality of apertures which are in alignment with the apertures of the flexible circuit board, and a plurality of elongated slots in predetermined positions which extend the entire width of the flexible circuit board which is temporarily affixed onto the carrier member. All of the components are soldered to the flexible circuit board, the carrier member acting as a support member to the components having leads.

7 Claims, 3 Drawing Figures

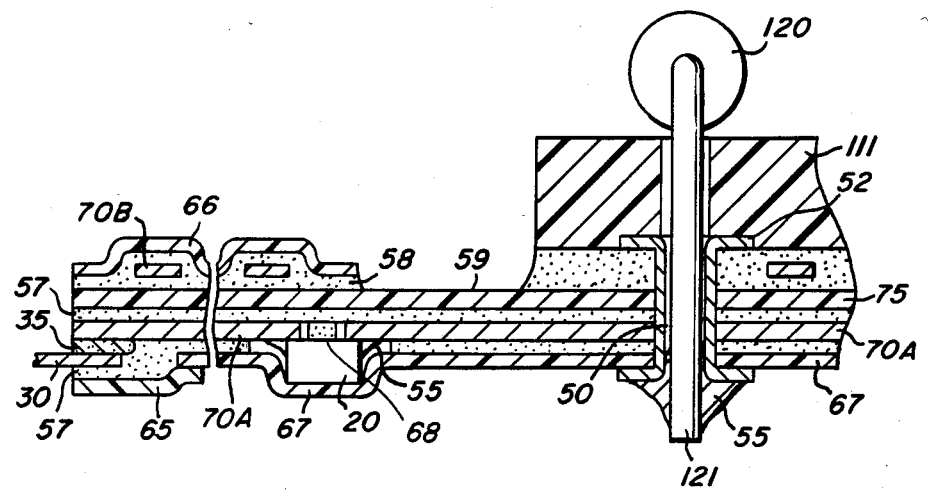
Fig 2
Fig 3
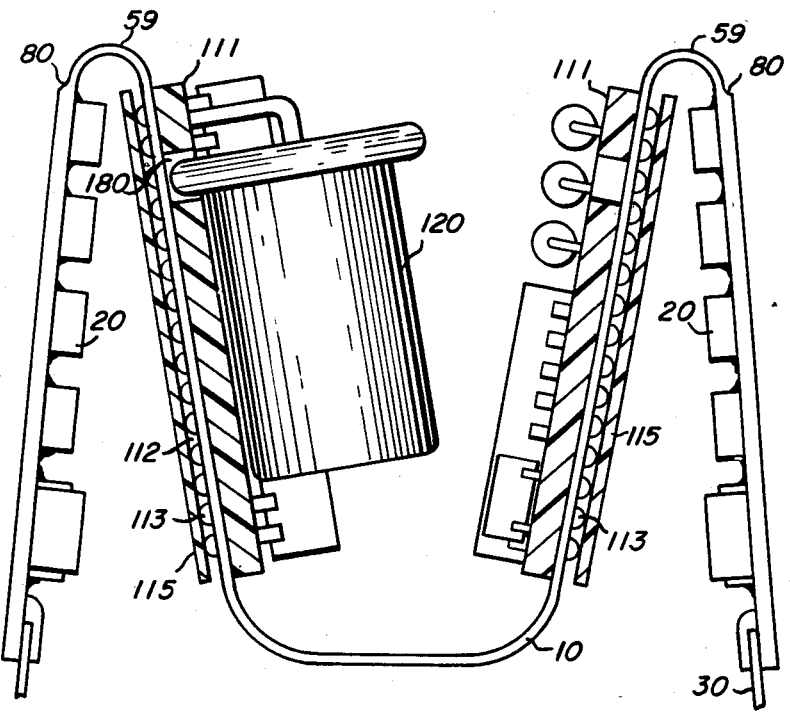

DOUBLE-SIDED FLEXIBLE ELECTRONIC CIRCUIT MODULE

BACKGROUND OF THE INVENTION

The present invention relates generally to flexible electronic circuit boards which carry multiple electrical components to comprise an electronic module and, in particular, the invention is directed to high component density constructions utilizing a flexible circuit board arrangement having leadless and leaded components affixed thereto in a manner which minimizes the necessary space requirements of the electronic module.

There are many instances where, due to the miniaturization and portability of an electronic device, the relative density of the electrical components contained therein places a premium on the available space. Utilization of available space becomes especially critical when both components with leads, such as crystal oscillators, integrated circuits, microprocessors, resistors, capacitors, etc., and leadless components such as chip capacitors and semiconductors, etc., are used on the same flexible electronic circuit board which will be incorporated in an electronic module.

High circuit density has been obtained in the past through the use of closely-placed discrete components or subassemblies on a circuit board construction with multiple strata or by the use of multilayer circuit board construction which will permit the close stacking of circuit boards into a common housing or frame. The introduction of leadless chip components, capable of being directly positioned on an associated circuit board through the use of automated techniques, has increased the density and complexity of the completed circuit board. Manufacturing such assemblies is expensive because of the investment in the capital equipment required to achieve the automation of such activity. Prior constructions have used a flexible printed circuit board having leaded components mounted to one side wherein the board is folded in an accordion manner to conserve space.

Portable, two-way communication equipment provides a particular advantageous application for printed circuitry in either flexible or rigid printed circuit board form. A single basic or master circuit board can be designed to retain the various required electronic components for the transmitter and receiver portions of a transceiver. A disadvantage is that the master printed circuit board, once designed and laid out, is thereby fixed operationally and not readily adaptable to meet any additional or alternative operational features. For example, in portable two-way communications equipment, optional features such as tone-coded squelch operation, automatic unit identification, digital voice privacy, etc., may comprise customer selectable options. Therefore it is desirable that these optional features be designed as separate circuit modules which can be plugged into the master circuit board on an as selected basis. Furthermore the optional modules must occupy a minimum of space to minimize the area alloted to receive same on the master circuit board.

Multilayer circuit boards have been used in an attempt to minimize the space requirements of circuit modules. Making connections to conductive paths which are internal to a multilayer printed circuit board is difficult when miniaturization of electronic circuits requires the printed circuit board to be small and its conductors very thin. This problem is particularly acute when flexible printed circuit boards are utilized. A common practice has been to connect these internal conductors by the use of plated-through holes, the interior of which are plated with a conductive metallic material, so that the electrical connections are made between layers of conductors and between components inserted into such holes.

A common disadvantage relating to all of the foregoing known prior art devices involves the relatively high cost, complexity and the quantity of piece parts which comprise the various packaging apparatus for a miniaturized circuit module.

SUMMARY OF THE INVENTION

It is, therefore, an object of this invention to provide a double-sided flexible electronic circuit module which carries leadless components on one side and leaded components on the other side suitable for wave soldering.

It is yet another object of the present invention to provide a double-sided flexible electronic circuit module and carrier assembly which will facilitate the wave soldering of the components with leads to the flexible circuit board while the module remains in the carrier assembly.

Still another object of the present invention is to provide a double-sided flexible electronic circuit module and carrier assembly which will facilitate the automated placement of leadless chip-type components on the flexible circuit board while the module remains in the carrier assembly.

Another object of the present invention is to provide a double-sided flexible electronic circuit module and carrier assembly which is of low cost and can be readily and easily manufactured.

In practicing the invention, a double-sided flexible electronic circuit module and carrier assembly is provided having a flexible double-sided printed circuit board. The flexible circuit board has a plurality of conductive paths on each surface and a plurality of conductively plated-through apertures in a predetermined pattern connected to the conductive paths. One side of the flexible circuit board is adapted to receive components with leads; the other side of the flexible circuit board is adapted to receive components without leads. A carrier member, larger than the flexible circuit board and of a size and shape sufficient to accommodate at least one flexible circuit board, is also provided. The carrier member has a plurality of apertures which are in alignment with corresponding apertures of the flexible circuit board and receive the leads of the leaded components. A plurality of elongated slots in the carrier member extend the entire width of the flexible circuit board which is affixed onto the carrier member. The leadless components are bonded to the solder side of the flexible circuit board on solder pads. The components with leads are inserted on the carrier member which acts as a support member. Connector pins are affixed to the flexible board using a high temperature solder. The carrier assembly is then run over a wave soldering device which solders the leadless components to the solder pads and solders the leads of the leaded components to plated-through holes on the flexible circuit board. The carrier member is sheared along the edges of the flexible board and only portions of the carrier member which support components with leads remains attached to the flexible circuit board. The flexible board is folded in accordion fashion prior to being inserted into a suitable protective housing.

BRIEF DESCRIPTION OF THE DRAWINGS

The features of the present invention which are believed to be novel are set forth with particularity in the claims. However, the invention itself, together with further objects and advantages thereof, may be best understood by reference to the following description when taken in conjunction with the accompanying drawings, in which like reference numerals refer to like elements in the several figures, and in which:

FIG. 2 is an enlarged cross-sectional view of a portion of the assembled flexible circuit board and carrier member taken along line 2—2 of FIG. 1 and shown in an inverted position.

FIG. 3 is an enlarged side view of a completed and folded flexible circuit module.

DETAILED DESCRIPTION OF THE PREFERRED EMBODIMENT

Figure 1:
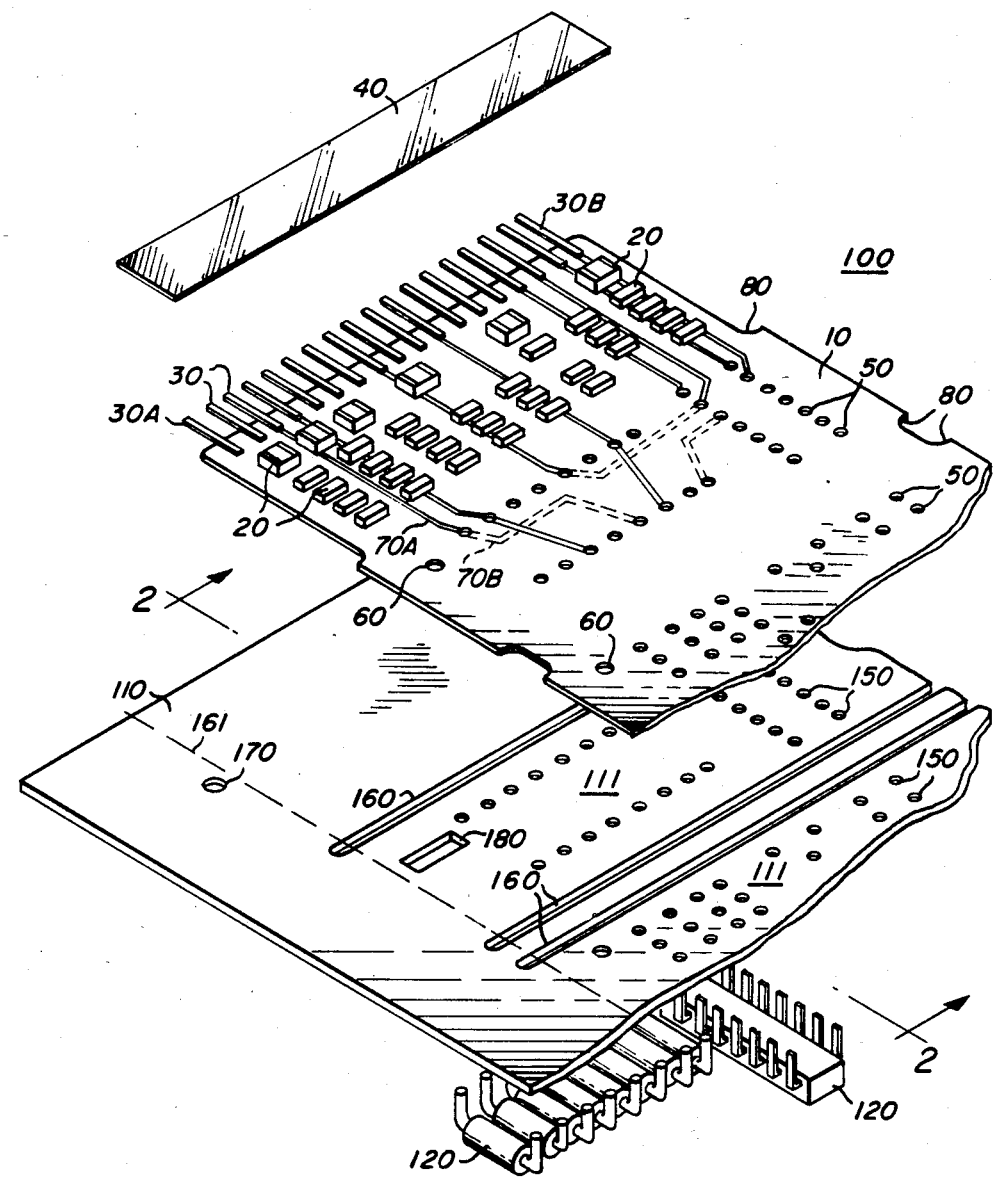
FIG. 1 is an enlarged exploded view in perspective of a portion of a double-sided flexible electronic circuit module and carrier assembly according to the present invention.

Referring now to the drawings, FIG. 1 illustrates a double-sided flexible electronic circuit module and carrier assembly 100 containing a flexible double-sided electronic circuit board 10 and a larger insulative carrier member 110. As is well known in the art, a double-sided electronic circuit board has co-planar metalized conductors selectively affixed to each of its two major surfaces. The insulative carrier member 110 may be sufficiently large and of a size and shape to carry a plurality of flexible double-sided electronic circuit boards 10, so as to expedite the manufacturing process. One surface of the flexible circuit board 10 we shall designate as the solder side, which is the surface depicted in FIG. 1. Various electronic chip-type leadless components 20 are preferrably arranged in a geometric pattern, such as a matrix, within a predetermined area at each end of the solder side of the flexible circuit board 10. This prevents the leadless components 20 from being damaged when the flexible circuit board 10 is folded in an accordion-like fashion prior to insertion into an associated protective housing (see FIG. 3). The leadless components 20 may be precisely positioned through the utilization of automated techniques and machinery. Leadless components 20 include such components as transistors, diodes, resistors, capacitors, etc., and are initially attached to the solder side of the printed circuit board 10 through the use of a curable adhesive 68 (see FIG. 2) or other suitable bonding agent. Beneath each of the chip components 20 are two or more conductive pads (not shown) on the board 10 upon which a tiny amount of conductive solder material has been placed to facilitate the electrical connections between the chip components 20 and the conductors 70a on the flexible circuit board 10.

Connector pins 30 are affixed to the conductors 70 on each end of the flexible circuit board 10 by the utilization of a high temperature (575–600 degrees Fahrenheit) solder paste. These pins serve to provide electrical connections between module 100 and the associated electronic equipment. The high temperature solder 35 (see FIG. 2) is used on pins 30 so that they are not affected when the flexible board 10 is later wave soldered. The pins 30 preferably project beyond the edge of board 10 by consecutively increasing lengths from pin 30a to pin 30b. This facilitates the connection of the completed circuit module 100 to an interconnect socket on the associated electronic equipment by minimizing the insertion force required since the pins will make sequential, not simultaneous, engagement with the socket. This also reduces the likelihood of bending one of the pins 30 during the plugging-in of the module.

The flexible circuit board 10 is attached to the insulative carrier member 110 by placing a piece of tape 40 having a suitable bonding agent attached to one side, over the extending pins 30 at each end of the flexible circuit board 10. A plurality of plated-through holes 50 are located in a predetermined pattern on the flexible circuit board 10, as well as a plurality of apertures 60 which are used to accomodate guide pins of an associated fixture (not shown). On each surface of the flexible circuit board 10 are metallized circuitry (conductors) 70a, 70b only a few of which are illustrated. Particular conductors 70b on the non-solder side are connected by the plated-through holes 50 to particular conductors 70a on the solder side of board 10. To give the flexible circuit board 10 greater pliability and flexibility, certain rounded recessed shoulder areas 80 are located along the side edges of the flexible circuit board 10 at the precise points where the flexible circuit board 10 is to be folded or bent.

With the board 10 attached to carrier 110 and this assembly positioned with the carrier being up, components 120 with leads are inserted into various apertures 150 located on the insulative carrier member 110. Apertures 150 are in alignment with the plated-through holes 50 located on the flexible circuit board 10. Thus, the insulative carrier member 110 acts as a support base for the components 120 with their leads projecting through the plated-through holes in the flexible circuit board 10. It is important to realize that the apertures designated to receive the components with leads (apertures 50 and 150) are located in predetermined central areas 111 on the insulative carrier member 110 and the flexible circuit board 10. This placement facilitates the folding of the module in an accordion-like manner to occupy minimal space.

The plurality of elongated slots 160 are slightly longer than the width of the associated flexible circuit board 10 and are located at locations on the insulative carrier member 110 about which the flexible board 10 will be bent. The flexible board is carried by the carrier member over a wave soldering machine wherein all components mounted to the flexible circuit board 10 are soldered. The carrier member is then sheared adjacent the sides of the flexible electronic circuit board 10 along lines 161 such that slots 160 are intersected. The carrier, except for areas 111, is removed from the flexible board. Sheets of an insulative material 115 (see FIG. 3) are bonded to the flexible board opposite areas 111 to prevent the leads of components 120 from shorting to components 20.

The insulative carrier member 110 has a plurality of locating apertures 170 which are used to insure proper alignment with the flexible board 10. A conventional fixture can be utilized to temporarily hold the carrier in alignment with the flexible board by means of holes 170 and 60. Additionally, the insulative carrier member 110 may include a number of recessed areas 180, of various sizes and shapes, to accommodate the differing physical configurations of the components 120.

In FIG. 2, the double-sided flexible electronic circuit module and carrier assembly 100 is illustrated in an inverted position to show the conventional orientation following the soldering of all of the various components and after the flexible circuit board has been cut away from the insulative carrier member. A component 120 with leads has been inserted into a respective aperture 50 having the inner surface which is plated with a conductive material 52. Solder 55 will migrate or wick up into this aperture 50, thereby providing a good electrical connection to the component lead 121. Following the cutting of the flexible circuit board from the assembly, only areas 111 of the insulative carrier member 110 remain to function as a support to the components 120 with leads. The various leadless components 20 have been conductively connected to the conductors 70a of the flexible electronic circuit board 10 by the reflow of solder 55.

The solder side metallized circuitry 70a has a layer of adhesive 57 on each of its two sides. A layer of protective cover coating 65, approximately 0.030" thick, surrounds the pins 30. A layer of a suitable cover coat material 67 is applied to protect the solder side of the flexible board. A polymide film material 75 is positioned and affixed to the non-solder side of circuitry 70a by a layer of adhesive 57. The non-solder side conductors 70b are positioned and affixed to the polymide film material 75 through the use of adhesive material 58. A cover coat 66 is used to protect the top of board 10. Tests have indicated that an acrylic adhesive is suitable for use for each of the adhesive agents 58 and 57. In those areas 59 where it is desirable to increase the pliability or flexibility of the flexible printed circuit board 10, it is desirable not to place the cover coat material 66.

In FIG. 3, the flexible circuit board 10 is shown folded in an accordion-like fashion just prior to being inserted into an associated protective housing. A layer of adhesive 112 is placed on one side of the epoxy fiberglass material 115 which is bonded to board 10 opposite areas 111 to prevent any electrical shorts between the solder connections 113 of the components 120 with leads and the numerous leadless components 20 when the flexible circuit board 10 has been folded in an accordion-like fashion. The leadless components 20 are preferably positioned in a geometric pattern so as to permit the maximum deflection of each of the respective ends of the flexible electronic circuit board 10 without detrimental effect to the solder connection of the leadless components. In one illustrative example, the leadless components can be position in a 5×8 matrix such that the spacing between the leadless components 20 which comprise the rows of the matrix is approximately equal to the average width of the leadless components 20 being utilized in the matrix; the spacing between the leadless components comprising the columns of the matrix is approximately equal to the average length of the leadless components 20. Additionally, the flexible circuit board 10 has rounded shoulders 80 at points 59 to permit increased flexibility and pliability. The absence of any final cover coat material 66 at points 59, which are adjacent points 80, for the flexible circuit board 10 also permits increased bendability of the flexible electronic circuit board 10 at the prescribed locations. The recessed areas 180, located on the insulative carrier member 110, provides a shock mounting of various components 120 with leads, as for example, crystal oscillators, when the flexible circuit board 10 is positioned within an associated protective housing.

Thus, there has been provided according to the present invention a simple and improved inexpensive double-sized flexible electronic circuit module and carrier assembly. Although the foregoing has been a description and illustration of a specific embodiment of the invention, various modifications and changes thereto can be made by persons skilled in the art within the scope and spirit of the invention as defined by the following claims.

What is claimed is:

1. A double-sided flexible electronic circuit module having a plurality of leadless components and components having leads comprising:
   a flexible circuit board having co-planar conductive circuitry affixed to both first and second sides;
   first means for electrically connecting certain conductors of said circuitry on said first side with certain conductors of said circuitry on said second side;
   non-conductive adhesive disposed between said leadless components and said first side, said leadless components being located within a first predetermined area on said flexible circuit board;
   an insulative carrier member mounted to said second side in a second predetermined area on said flexible circuit board contiguously supporting said components with leads, said second predetermined area spaced apart from and not overlapping said first predetermined area, said carrier having a first set of holes receiving said leads and said flexible circuit board having a second set of holes in alignment with said first set of holes with said leads passing through said carrier member to said first side of said flexible circuit board;
   solder connecting said leadless components and components with leads to selected conductors on said first side of said flexible circuit board; and
   second means for providing electrical connections to said conductors.

2. The module according to claim 1 wherein said first electrical connecting means comprises plated-through holes defined by said flexible circuit board.

3. The module according to claim 1 wherein said second electrical connection means comprises a plurality of rigid conductive pins projecting from said flexible circuit board.

4. The module according to claim 3 wherein said pins are connected to said conductors with a high temperature solder which has a higher melting temperature than said solder.

5. The module according to claim 1 wherein the region between said second predetermined area and said first predetermined area is void of said leadless components and said components with leads.

6. The module according to claim 5 wherein said region on said flexible circuit board is of a reduced width which permits said board to be folded along said region.

7. The module according to claim 3 wherein said pins comprise a row of pins having a first pin and a last pin, the distance each pin extends from said board increasing consecutively from said first pin to said last pin.

* * * * *